(12) United States Patent
Hung et al.

(10) Patent No.: US 9,166,024 B2
(45) Date of Patent: Oct. 20, 2015

(54) FINFET STRUCTURE WITH CAVITIES AND SEMICONDUCTOR COMPOUND PORTIONS EXTENDING LATERALLY OVER SIDEWALL SPACERS

(71) Applicant: United Microelectronics Corp., Hsinchu (TW)

(72) Inventors: Yu-Hsiang Hung, Tainan (TW); Ssu-I Fu, Kaohsiung (TW); Chung-Fu Chang, Tainan (TW); Yen-Liang Wu, Taipei (TW); Cho-Han Fan, Tainan (TW); Chien-Ting Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/042,190

(22) Filed: Sep. 30, 2013

(65) Prior Publication Data

US 2015/0091059 A1    Apr. 2, 2015

(51) Int. Cl.
*H01L 29/66* (2006.01)
*H01L 29/78* (2006.01)
*H01L 21/8238* (2006.01)
*H01L 29/165* (2006.01)

(52) U.S. Cl.
CPC .. *H01L 29/66795* (2013.01); *H01L 21/823807* (2013.01); *H01L 21/823814* (2013.01); *H01L 21/823821* (2013.01); *H01L 29/66636* (2013.01); *H01L 29/785* (2013.01); *H01L 29/7834* (2013.01); *H01L 29/7848* (2013.01); *H01L 29/165* (2013.01)

(58) Field of Classification Search
CPC ........ H01L 29/66; H01L 29/78; H01L 29/267

USPC ........................................... 257/192; 438/283
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo et al. | |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,470,570 B2 | 12/2008 | Beintner et al. | |
| 7,531,437 B2 | 5/2009 | Brask et al. | |
| 7,569,857 B2 | 8/2009 | Simon et al. | |
| 8,236,659 B2 | 8/2012 | Tsai et al. | |
| 8,362,575 B2 * | 1/2013 | Kwok et al. | 257/401 |
| 8,772,120 B2 * | 7/2014 | Chang et al. | 438/300 |
| 9,076,689 B2 * | 7/2015 | Yu et al. | H01L 27/1211 |
| 2004/0195624 A1 | 10/2004 | Liu et al. | |
| 2005/0051825 A1 | 3/2005 | Fujiwara et al. | |
| 2006/0099830 A1 | 5/2006 | Walther et al. | |
| 2006/0286729 A1 | 12/2006 | Kavalieros et al. | |

(Continued)

*Primary Examiner* — Marc Armand
*Assistant Examiner* — Younes Boulghassoul
(74) *Attorney, Agent, or Firm* — J.C. Patents

(57) ABSTRACT

A process for fabricating a fin-type field effect transistor (FinFET) structure is described. A semiconductor substrate is patterned to form a fin. A spacer is formed on the sidewall of the fin. A portion of the fin is removed, such that the spacer and the surface of the remaining fin together define a cavity. A piece of a semiconductor compound is formed from the cavity, wherein the upper portion of the piece of the semiconductor compound laterally extends over the spacer.

2 Claims, 4 Drawing Sheets

(56) References Cited

U.S. PATENT DOCUMENTS

| | | |
|---|---|---|
| 2007/0108528 A1 | 5/2007 | Anderson et al. |
| 2007/0158756 A1 | 7/2007 | Dreeskornfeld et al. |
| 2008/0157208 A1 | 7/2008 | Fischer et al. |
| 2009/0124097 A1 | 5/2009 | Cheng |
| 2009/0242964 A1 | 10/2009 | Akil et al. |
| 2009/0269916 A1 | 10/2009 | Kang et al. |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0167506 A1 | 7/2010 | Lin et al. |
| 2011/0147842 A1* | 6/2011 | Cappellani et al. ........... 257/365 |
| 2014/0239255 A1* | 8/2014 | Kang et al. ....................... 257/24 |
| 2014/0299934 A1* | 10/2014 | Kim et al. ...................... 257/347 |
| 2014/0367741 A1* | 12/2014 | Yang et al. .................... 257/190 |
| 2014/0367800 A1* | 12/2014 | Lee et al. ...................... 257/402 |
| 2015/0187943 A1* | 7/2015 | Lee et al. ............ H01L 29/7851 |

\* cited by examiner

FINFET STRUCTURE WITH CAVITIES AND SEMICONDUCTOR COMPOUND PORTIONS EXTENDING LATERALLY OVER SIDEWALL SPACERS

BACKGROUND OF THE INVENTION

1. Field of Invention

This invention relates to a semiconductor process and a product thereof, and more particularly relates to a process for fabricating a fin-type field effect transistor (FinFET) structure, and a FinFET structure fabricated through the process.

2. Description of Related Art

A FinFET typically includes a semiconductor fin, a gate crossing over the fin to form a tri-gate structure, and a source and a drain beside the portion of the fin under the gate. In a strained silicon process applied to FinFET, the portions of the fin not under the gate are recessed after the gate is formed, and a semiconductor compound having a lattice parameter different from that of the material of the fin is grown based on the recessed portions of the fin to serve as a source and a drain.

However, because the piece of the semiconductor compound grown based on the recessed portions of a fin grows also in the lateral direction, it may contact with a piece of the semiconductor compound on a neighboring fin to cause a short circuit. Though increasing the distance between two neighboring fins in such a process is capable of preventing a short circuit, the integration degree of devices is reduced by doing so.

SUMMARY OF THE INVENTION

In view of the foregoing, this invention provides a process for fabricating a fin- type field effect transistor (FinFET) structure.

This invention also provides a FinFET structure that can be fabricated through the process of this invention.

According to an aspect of this invention, the process for fabricating a FinFET structure of this invention includes the following step. A semiconductor substrate is patterned to form a plurality of fins. A gate dielectric layer is formed on the surfaces of the fins. The gate dielectric layer is trimmed to reduce the thickness thereof. A spacer material layer is formed on the trimmed gate dielectric layer.

In an embodiment of the above aspect of this invention, the step of trimming the gate dielectric layer includes a dry or wet etching step.

According to another aspect of this invention, the process for fabricating a FinFET structure of this invention includes the following step. A semiconductor substrate in a first area is patterned to form a first fin. A first spacer is formed on the sidewall of the first fin. A portion of the first fin is removed, such that the first spacer and the surface of the remaining first fin define a first cavity. A piece of a first semiconductor compound is formed from the first cavity, wherein the upper portion of the piece of the first semiconductor compound laterally extends over the first spacer.

In an embodiment of another aspect of this invention, the process further includes the following step. The substrate in a second area is patterned to form a second fin. A second spacer is formed on the sidewall of the second fin. A portion of the second fin is removed, such that the second spacer and the surface of the remaining second fin define a second cavity. A piece of a second semiconductor compound is formed from the second cavity, wherein the upper portion of the piece of the second semiconductor compound laterally extends over the second spacer.

In the above process of this invention, since the gate dielectric layer is trimmed to reduce the thickness thereof before the spacer material layer is formed, the portions of the spacer material layer on neighboring fins will not merge later, so the spacer material formed over the fins will not be overly thick. In addition, the thinned gate dielectric layer on the top of the fin is easier to remove. As a result, the cavity formed by partial removal of the fin for forming the semiconductor compound is allowed to have a sufficient depth, so that the volume and the strain of the formed semiconductor compound will be sufficient.

Moreover, since the semiconductor compound is formed from the cavity defined by the surface of the remaining fin and the spacer, the lower portion of the piece of the semiconductor compound is confined by the spacer, so the upper portions of the pieces of the semiconductor compound on neighboring fins will not contact with each other and the process margin can be increased.

According to yet another aspect of this invention, the FinFET structure of this invention includes a first fin, a first spacer and a piece of a first semiconductor compound. The first fin is disposed over a substrate. The first spacer is disposed over the sidewall of the first fin, and extends upward to define, in combination with the first fin, a first cavity. The piece of the first semiconductor compound includes a first lower portion in the first cavity, and a first upper portion over the first lower portion and laterally extending over the first spacer.

In an embodiment of the yet another aspect of this invention, the structure further includes a second fin, a second spacer and a piece of a second semiconductor compound. The second fin is disposed over a substrate. The second spacer is disposed on the sidewall of the second fin, and extends upward to define, in combination with the second fin, a second cavity. The piece of the second semiconductor compound includes a second lower portion in the second cavity, and a second upper portion over the second lower portion and laterally extending over the second spacer.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit the scope thereof. For example, though the semiconductor compound of the P-type FinFET is formed first in the embodiment, it is also possible to form the semiconductor compound of the N-type FinFET first in other embodiments. In such cases, it is possible that the first semiconductor compound comprises silicon phosphorous (SiP) and the second semiconductor compound comprises SiGe.

FIGS. 1-11 illustrate, in a cross-sectional view, a process for fabricating a FinFET structure according to an embodiment of this invention, which is integrated with a fabrication process of ordinary strained CMOS devices.

Figure 1:
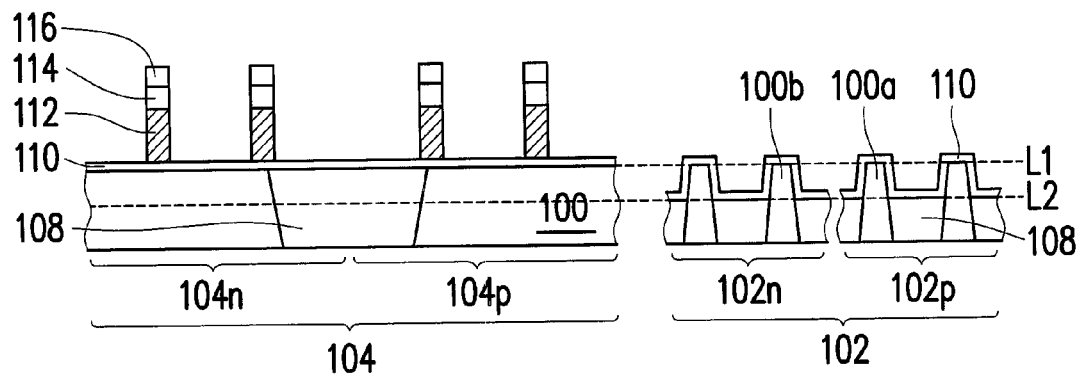
FIGS. 1-11 illustrate, in a cross-sectional view, a process for fabricating a FinFET structure according to an embodiment of this invention, which is integrated with a fabrication process of ordinary strained CMOS devices, wherein FIG. 11 also illustrates a FinFET structure according to the embodiment of this invention.

Referring to FIG. 1, a semiconductor substrate 100 is provided, which may be a single-crystal silicon substrate. The substrate 100 includes a FinFET area 102 and an ordinary device area 104. The FinFET area 102 includes a NMOS area 102n and a PMOS area 102p. The ordinary device area 104 includes a NMOS area 104n and a PMOS area 104p.

The substrate 100 in the FinFET area 102 is patterned to form a plurality of fins 100a and 100b, wherein the fins 100a is in the PMOS area 102p and the fins 100b in the NMOS area 102n. At the same time, the trench for forming the isolation layer 108 of the ordinary devices is formed in the substrate 100 in the ordinary device area 104. An insulating material, such as silicon dioxide, is then filled in between the fins 100a in the PMOS FinFET area 102p, in between the fins 100b in the NMOS FinFET area 102n, and in the trench in the ordinary device area 104 to form isolation layers 108. For easier reference of the subsequent steps and descriptions, the level of the top of the substrate 100 in the ordinary device area 104 and the tops of the fins 100a and 100b in the FinFET area 102 is marked by a dash line L1, and the level of the top of the isolation layer 108 in the FinFET area 102 is marked by a dash line L2.

A gate dielectric layer 110, which may include silicon oxide or a high-k material, is formed on the surfaces of the fins 100a and 100b exposed outside of the isolation layer 108 in the FinFET area 102 and on the substrate 100 in the ordinary device area 104. The thickness of the gate dielectric layer 110 may range from 30 Å to 60 Å.

Thereafter, a conductor layer 112, a first hard mask layer 114 and a second hard mask layer 116 are sequentially formed over the gate dielectric layer 110 and then patterned to form the gates 112 of the ordinary PMOS and NMOS devices and the gates (not seen in this cross section) of the P-type and N-type FinFETs. The conductor layer 112 may include, e.g., doped poly-Si. The first hard mask layer 114 and the second hard mask layer 116 include different materials, e.g., SiN and SiO, respectively.

Figure 2:
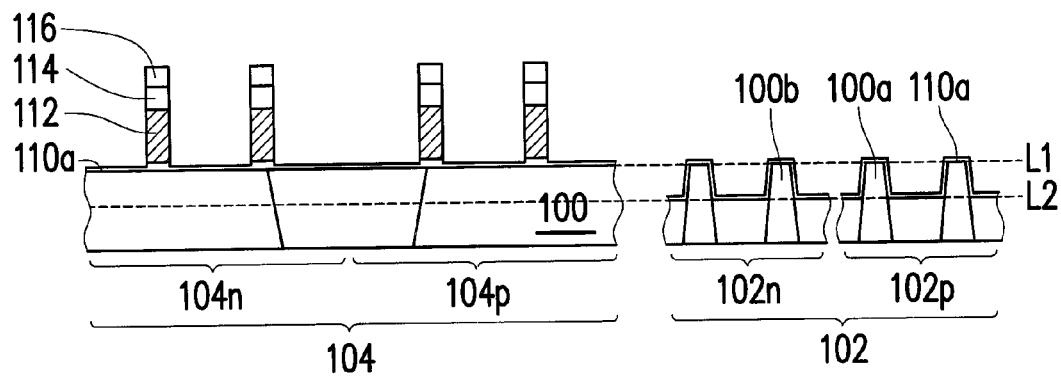

Referring to FIG. 2, the exposed gate dielectric layer 110 is trimmed, possibly with a dry or wet etching step, to reduce the thickness thereof. The dry etching step may use the Siconi® pre-clean recipe, etc. The wet etching step may use dilute hydrofluoric acid (DHF), etc. The trimmed gate dielectric layer 110a may have a thickness within the range of 10 to 30 Å.

Figure 3:
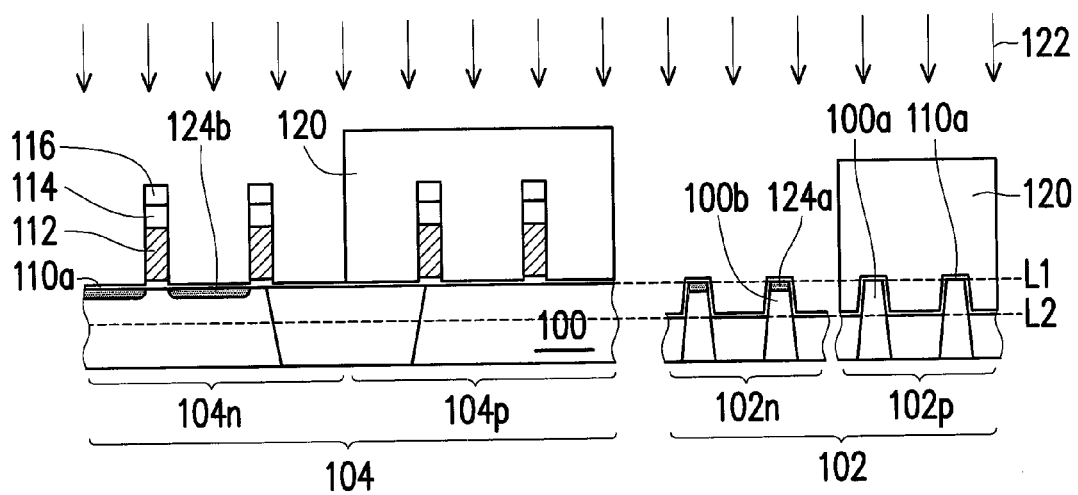

Referring to FIG. 3, a patterned mask layer 120, which is usually a patterned photoresist layer, is formed covering the PMOS FinFET area 102p and the ordinary PMOS area 104p. Using the patterned mask layer 120 as a mask, an implant process 122 is then performed to the fins 100b in the NMOS FinFET area 102n and the substrate 100 in the ordinary NMOS area 104n. The implant process 122 may include an N-type S/D extension implant step that forms S/D extension regions 124a of the N-type FinFETs and S/D extension regions 124b of the ordinary NMOS devices, or include an N-type S/D extension implant step and a P-type pocket implant step (the P-type pocket doped regions are not shown).

Figure 4:
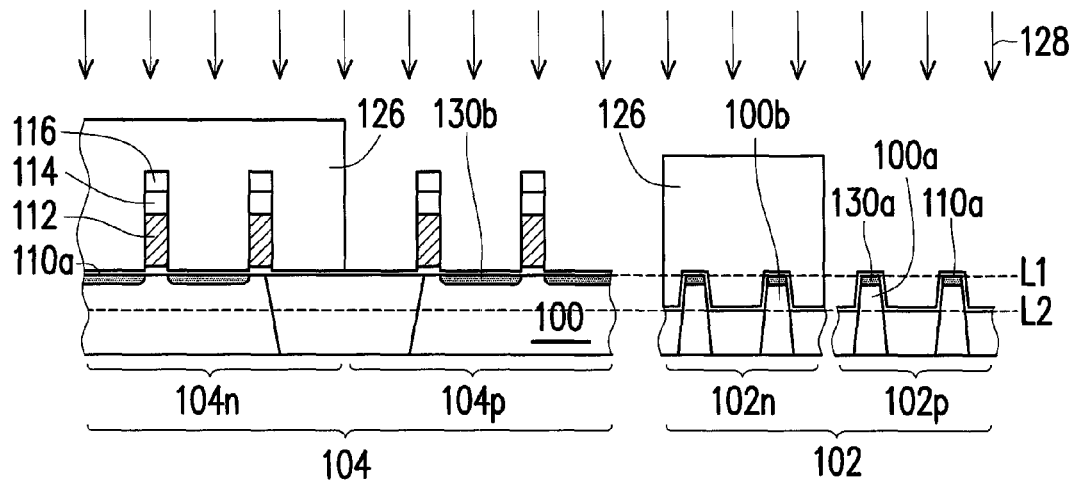

Referring to FIG. 4, the patterned mask layer 120 is removed, and then another patterned mask layer 126, which is also usually a patterned photoresist layer, is formed covering the NMOS FinFET area 102n and the ordinary NMOS area 104n. Using the patterned mask layer 126 as a mask, an implant process 128 is then performed to the fins 100a in the PMOS FinFET area 102p and the substrate 100 in the ordinary PMOS area 104p. The implant process 128 may include a P-type S/D extension implant step that forms S/D extension regions 130a of the P-type FinFET and SID extension regions 130b of the ordinary PMOS devices, or include a P-type S/D extension implant step and an N-type pocket implant step (the N-type pocket doped regions are not shown).

Figure 5:
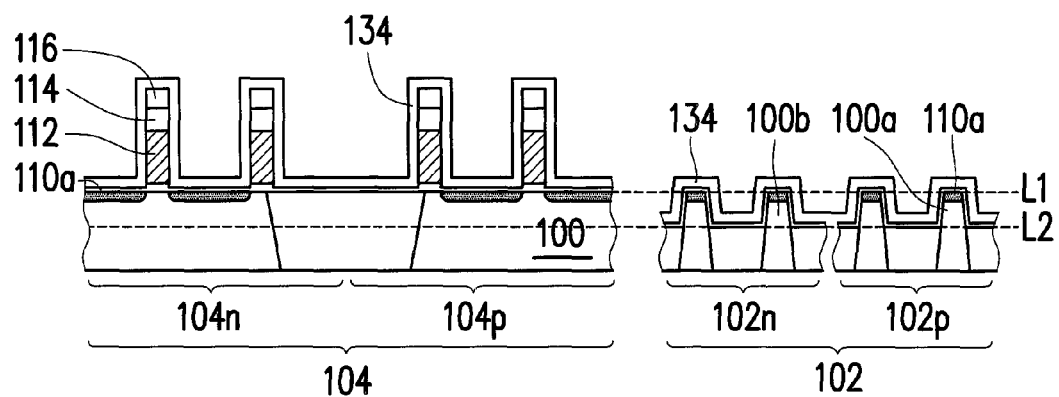

Referring to FIG. 5, the patterned mask layer 126 is removed, and then a blanket spacer material layer 134, which is substantially conformal with the above-resulting structure, is formed over the entire substrate. The material of the spacer material layer 134 is different from that of the gate dielectric layer 110a, and may be SiN, for example. The thickness of the spacer material layer 134 may range from 80 Å to 130 Å.

Since the gate dielectric layer 110 has been trimmed to reduce the thickness thereof before the spacer material layer 134 is formed, the portions of the spacer material layer 134 on neighboring fins 100a/b will not merge later, so the spacer material formed over the fins 100a/b will not be overly thick. In addition, the thinned gate dielectric layer 110a on the top of the fins 100a/b is easier to remove. As a result, the cavities later formed by partial removal of the fins 100a/b for forming the semiconductor compounds are allowed to have sufficient depths, so that the volume and the strain of the formed semiconductor compounds will be sufficient.

Figure 6:
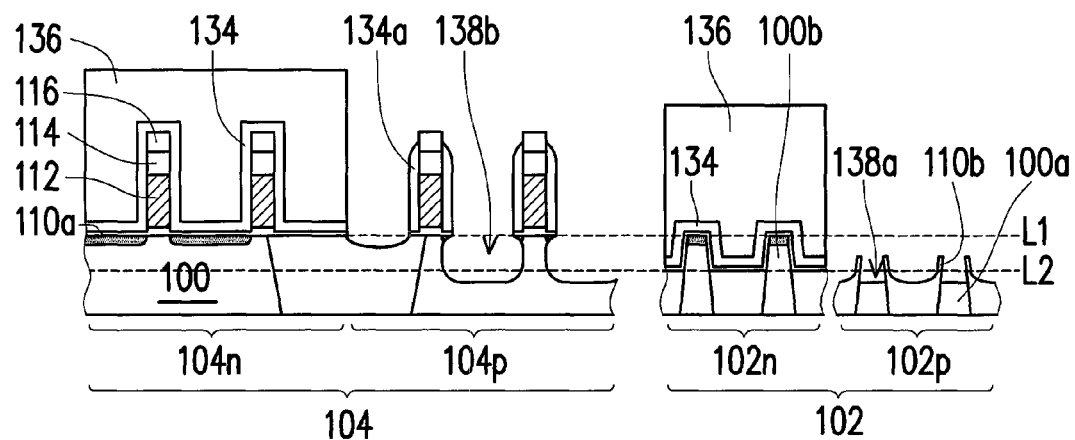

Referring to FIGS. 5-6, a patterned mask layer 136, which is usually a patterned photoresist layer, is formed covering the NMOS FinFET area 102n and the ordinary NMOS area 104n. The exposed portions of the spacer material layer 134 are then subjected to anisotropic etching, such that the portion in the ordinary PMOS area 104p becomes a spacer 134a on the sidewall of each gate 112 but the portion in the PMOS FinFET area 102p in the area 102 is entirely removed due to its smaller height. The anisotropic etching is continued to remove the trimmed gate dielectric layer 110a on the tops of the fins 100a and on the surface of the substrate 100 in the PMOS area 104p in the ordinary device area 104, and then remove a portion of each of the fins 100a and a portion of the substrate 100 in the ordinary PMOS area 104p to form cavities 138a and 138b in the PMOS FinFET area 102p and the ordinary PMOS area 104p, respectively.

The above process is controlled in a manner such that the trimmed gate dielectric layer 110a on the sidewall of each fin 100a is not entirely removed and a spacer 110b is left behind, which extends upward over the remaining part of the fin 100a. Thus, for each fin 100a, the spacer 110b and the surface of the remaining portion of the fin 100a together define the cavity 138a. The bottom of the cavity 138a may be lower than the level L2 of the top of the isolation layer 108 (FIG. 1) in the FinFET area 102, in order to provide a sufficient volume for subsequent formation of the first semiconductor compound, which may be carried out with SiGe epitaxy.

Figure 7:
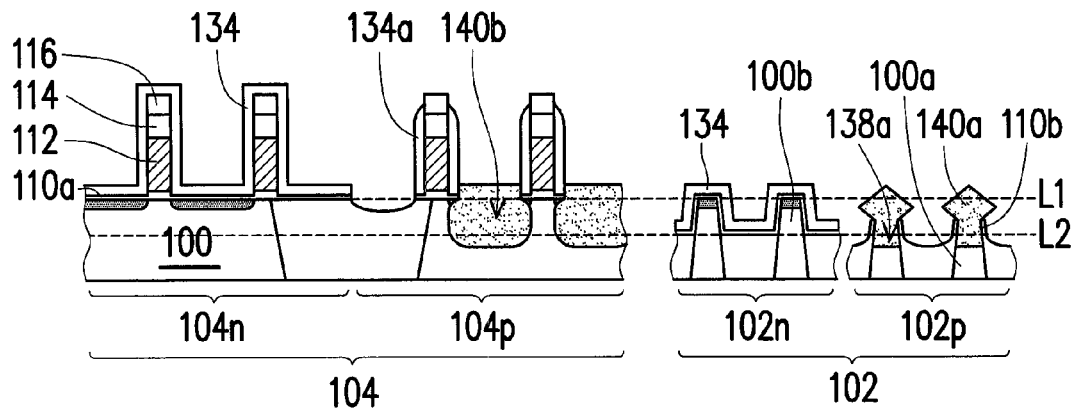

Referring to FIG. 7, the patterned mask layer 136 is removed, and then a piece 140a of a first semiconductor compound is formed from each cavity 138a in the PMOS FinFET area 102p and also a piece 140b of the first semiconductor compound is formed from each cavity 138b in the ordinary PMOS area 104p. The first semiconductor compound may include SiGe, and may be formed with an epitaxial process, which may include in-situ P-type doping.

Since in the PMOS FinFET area 102p the first semiconductor compound is formed from the cavity 138a defined by the spacer 110b and the remaining part of the fin 100a, the lower portion of the piece 140a of the first semiconductor compound is confined by the spacer 110b, so that the upper portions of the pieces 140a of the semiconductor compound on neighboring fins 100a will not contact with each other to cause a short circuit and the process margin can be increased.

For example, in a case where the first semiconductor compound is formed by an epitaxial process, the spacer 110b confines the lateral growth of the first semiconductor compound, so the first semiconductor compound is not allowed to grow laterally until growing outside of the cavity 138a. Thus, even though the upper portion of each piece 140a of the first semiconductor compound extends laterally over the spacer 110b, the upper portions of the pieces 140a of the first semiconductor compound on neighboring fins 100a will not merge to cause short circuit.

Figure 8:
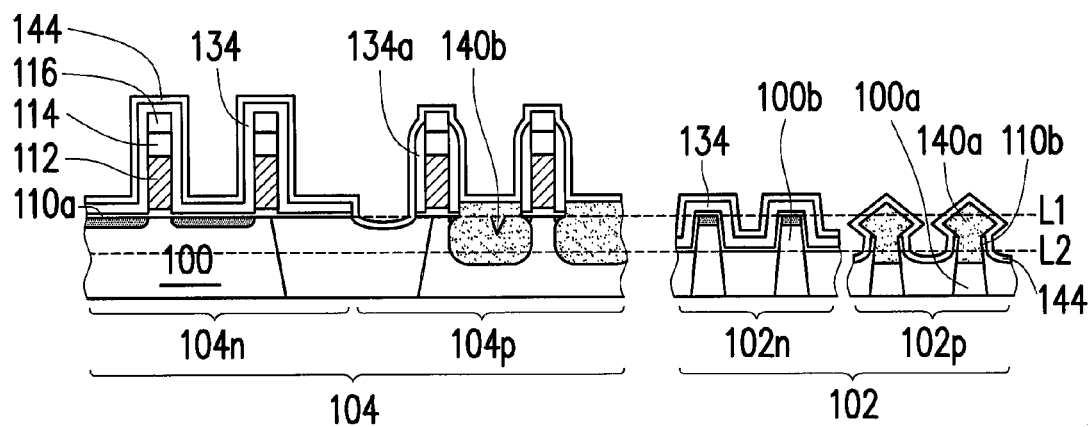

Referring to FIG. 8, a blanket blocking layer 144 substantially conformal to the above-resulting structure is formed over the entire substrate. The material of the layer 144 may be the same as or different from that of the spacer material layer 134, such as SiN, SiCN, or SiN on $SiO_2$, and may have a thickness in the range of 40 to 80 Å.

Figure 9:
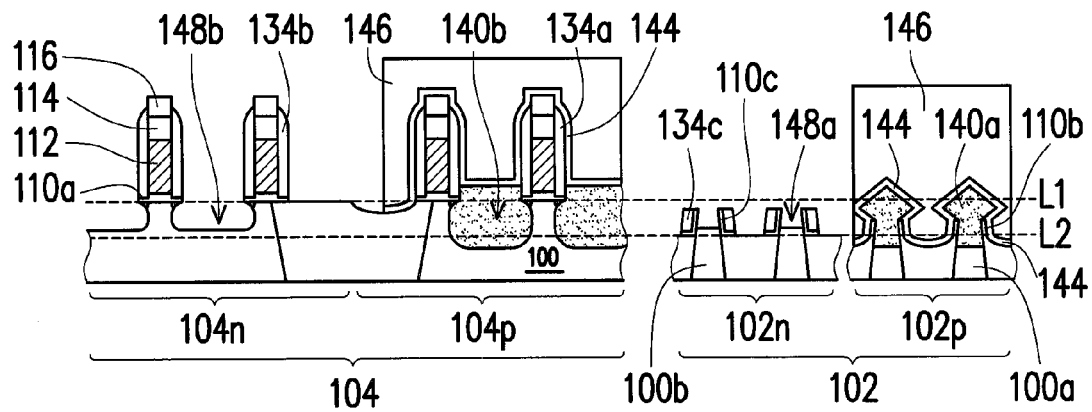

Referring to FIGS. 8 and 9, a patterned mask layer 146, which is also usually a patterned photoresist layer, is formed covering the PMOS FinFET area 102p and the ordinary PMOS area 104p. The exposed portions of the blocking layer 144 are then removed. The exposed portions of the spacer material layer 134 and the trimmed gate dielectric layer 110a are then subjected to anisotropic etching to form a spacer 134b beside each gate 112 in the ordinary NMOS area 104n and simultaneously form a spacer 134c and a spacer 110c on the sidewall of each fin 100b in the NMOS FinFET area 102n. The spacer 134c and the spacer 110c together serve as an aforementioned second spacer (the spacer 110b serves as the first spacer). A portion of each fin 100b and the exposed portions of the substrate 100 in the ordinary NMOS area 104n are then removed to form cavities 148a and cavities 148b in the NMOS FinFET area 102n and the ordinary NMOS area 104n, respectively. The bottom of each cavity 148a may be higher than the level L2 of the top of the isolation layer 108 (FIG. 1) in the FinFET area 102, so that each cavity 138a from which the first semiconductor compound (e.g., SiGe) is formed (FIGS. 6-7) is deeper than each cavity 148a. The reason/effect of such a design is of SiGe strain concern.

Figure 10:
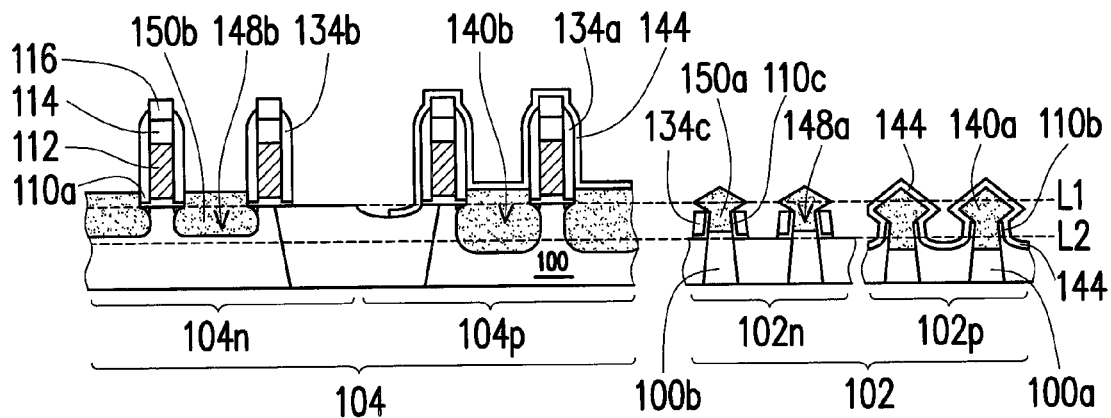

Referring to FIG. 10, the patterned mask layer 146 is removed, and then a piece 150a of a second semiconductor compound is formed from each cavity 148a in the NMOS FinFET area 102n and also a piece 150b of the second semiconductor compound is formed from each cavity 148b in the ordinary NMOS area 104n. The first semiconductor compound (140a and 140b) in the PMOS FinFET area 102p and the ordinary PMOS area 104p is not affected during the formation of the second semiconductor compound due to the blocking effect of the blocking layer 144. The second semiconductor compound may include silicon phosphorous (SiP), and may be formed with an epitaxial process.

Since in the NMOS FinFET area 102n the second semiconductor compound is formed from the cavity 148a defined by the spacer 110c+134c and the surface of the remaining part of the fin 100b, the lower portion of the piece 150a of the second semiconductor compound is confined by the spacer 110c, so the upper portions of the pieces 150a of the second semiconductor compound on neighboring fins 100b will not contact with each other to cause a short circuit and the process margin can be increased.

For example, in case the second semiconductor compound is formed by epitaxy, the spacer 110c+134c will confine the lateral growth of the second semiconductor compound, so the second semiconductor compound is not allowed to grow laterally until growing outside of the cavity 148a. Thus, even though the upper portion of each piece 150a of the second semiconductor compound extends laterally over the spacer 110c+134c, the upper portions of the pieces 150a of the second semiconductor compound on neighboring fins 100b will not merge to cause short circuit.

Figure 11:
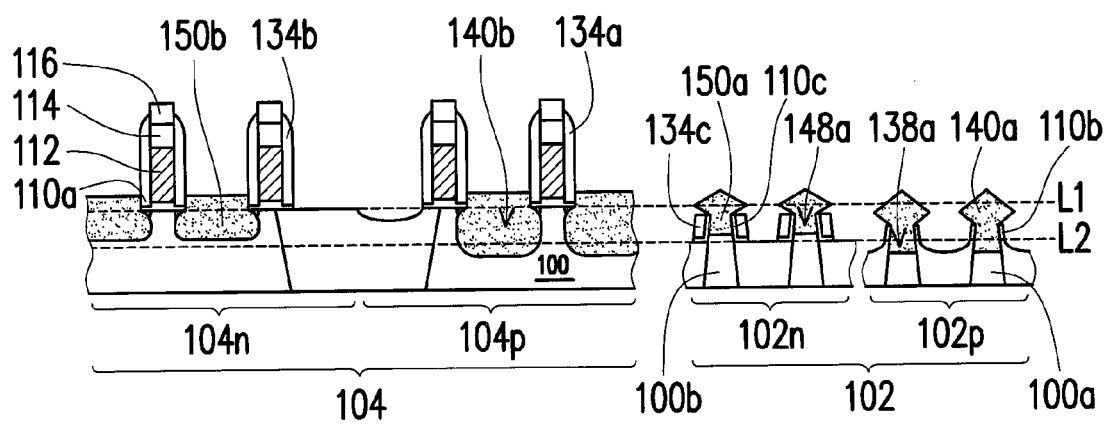

Referring to FIG. 11, the blocking layer 144 is removed, possibly by wet etching.

FIG. 11 also illustrates a FinFET structure according to the embodiment of this invention. The FinFET structure of this invention includes first fins 100a, first spacers 110b and pieces of the first semiconductor compound 140a in a PMOS area 102p, and second fins 100b, second spacers 110c+134c and pieces of the second semiconductor compound 150a in a NMOS area 102n.

In the PMOS FinFET area 102p, each first spacer 110b is disposed over the sidewall of a first fin 100a, and extends upward to define, in combination with the first fin 100a, a first cavity 138a. The piece of the first semiconductor compound 140a includes a lower portion in the first cavity 138a, and an upper portion over the lower portion and laterally extending over the first spacer 110b. The first semiconductor compound may be SiGe.

In the NMOS FinFET area 102n, each second spacer 110c+134c, which includes a spacer 110c coming from the gate dielectric layer possibly including silicon oxide and a spacer 134c possibly including SiN, is disposed over the sidewall of a second fin 100b, and extends upward to define, in combination with the second fin 100b, a second cavity 148a. The piece of the second semiconductor compound 150a includes a lower portion in the first cavity 148a, and an upper portion over the lower portion and laterally extending over the second spacer 110c+134c. The second semiconductor compound may be SiP. The first cavity 138a from which the first semiconductor compound 140a (e.g., SiGe) is formed may be deeper than the second cavity 148a from which the second semiconductor compound 150a (e.g., SiP).

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A fin-type field effect transistor (FinFET) structure, comprising:
   a first fin over a substrate;
   an isolation layer, located on a sidewall of the first fin;
   a first spacer, disposed on a top of the isolation layer and on the sidewall of the first fin, and extending upward to define, in combination with the first fin, a first cavity;
   a piece of a first semiconductor compound, including a first lower portion in the first cavity, and a first upper portion over the first lower portion and laterally extending over the first spacer, wherein the isolation layer is in direct contact with the first fin and the first semiconductor compound;
   a second fin over a substrate;
   a second spacer, disposed on a sidewall of the second fin, and extending upward to define, in combination with the second fin, a second cavity; and
   a piece of a second semiconductor compound, including a second lower portion in the second cavity, and a second upper portion over the second lower portion and laterally extending over the second spacer,
   wherein the first semiconductor compound comprises SiGe, and the first spacer comprise silicon oxide, and the second semiconductor compound comprises silicon phosphorous (SiP), and the second spacer comprises a silicon oxide spacer on the sidewall of the second fin and a SiN spacer on a sidewall of the silicon oxide spacer.

2. The FinFET structure of claim 1, wherein the first cavity is deeper than the second cavity.

* * * * *